(12) United States Patent
Hosoya et al.

(10) Patent No.: US 9,564,517 B2
(45) Date of Patent: Feb. 7, 2017

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Kunio Hosoya, Kanagawa (JP); Saishi Fujikawa, Kanagawa (JP); Yoko Chiba, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1 day.

(21) Appl. No.: 14/282,593

(22) Filed: May 20, 2014

(65) Prior Publication Data
US 2014/0256095 A1   Sep. 11, 2014

Related U.S. Application Data

(63) Continuation of application No. 12/255,312, filed on Oct. 21, 2008, now abandoned.

(30) Foreign Application Priority Data

Oct. 23, 2007   (JP) ................................. 2007-275781

(51) Int. Cl.
   *H01L 27/12*   (2006.01)
   *H01L 29/66*   (2006.01)
(52) U.S. Cl.
   CPC ..... *H01L 29/66765* (2013.01); *H01L 27/1214* (2013.01); *H01L 27/1288* (2013.01)
(58) Field of Classification Search
   CPC .................. H01L 27/1288; G02F 2001/13625

USPC ......................................................... 438/160
See application file for complete search history.

(56) References Cited

U.S. PATENT DOCUMENTS

| | | |
|---|---|---|
| 4,409,134 A | 10/1983 | Yamazaki |
| 5,530,265 A | 6/1996 | Takemura |
| 5,757,444 A | 5/1998 | Takemura |
| 6,008,065 A | 12/1999 | Lee et al. |
| 6,372,560 B1 | 4/2002 | Jen et al. |
| 6,485,997 B2 | 11/2002 | Lee et al. |

(Continued)

FOREIGN PATENT DOCUMENTS

| | | |
|---|---|---|
| JP | 03-011744 A | 1/1991 |
| JP | 2000-131719 A | 5/2000 |

(Continued)

OTHER PUBLICATIONS

Kim.C et al., "A Novel Four-Mask-Count Process Architecture for TFT-LCDS", SID Digest '00 : SID International Symposium Digest of Technical Papers, 2000, vol. 31, pp. 1006-1009.

*Primary Examiner* — Bryan Junge
(74) *Attorney, Agent, or Firm* — Fish & Richardson P.C.

(57) ABSTRACT

To provide a manufacturing method of a highly reliable TFT, by which a more refined pattern can be formed through a process using four or three masks, and a semiconductor device. A channel-etched bottom gate TFT structure is adopted in which a photoresist is selectively exposed to light by rear surface exposure utilizing a gate wiring to form a desirably patterned photoresist, and further, a halftone mask or a gray-tone mask is used as a multi-tone mask. Further, a step of lifting off using a halftone mask or a gray-tone mask and a step of reflowing a photoresist are used.

16 Claims, 11 Drawing Sheets

(56) References Cited

U.S. PATENT DOCUMENTS

| | | |
|---|---|---|
| 6,493,048 B1 | 12/2002 | Baek et al. |
| 6,635,581 B2 | 10/2003 | Wong |
| 6,797,982 B2 | 9/2004 | Okada et al. |
| 7,023,021 B2 | 4/2006 | Yamazaki et al. |
| 7,098,062 B2 * | 8/2006 | Shih .................... H01L 27/1288 257/72 |
| 7,126,157 B2 | 10/2006 | Okada et al. |
| 7,223,643 B2 | 5/2007 | Ohnuma et al. |
| 7,348,198 B2 | 3/2008 | Ahn |
| 7,459,723 B2 | 12/2008 | Okada et al. |
| 7,553,712 B2 | 6/2009 | Shyu |
| 7,554,616 B1 | 6/2009 | Takemura |
| 7,671,367 B2 | 3/2010 | Ahn |
| 7,696,516 B2 | 4/2010 | Okada et al. |
| 7,816,193 B2 * | 10/2010 | Lin ..................... H01L 27/1248 257/E21.414 |
| 7,824,939 B2 | 11/2010 | Hosoya et al. |
| 7,829,391 B2 | 11/2010 | Okada et al. |
| 8,059,236 B2 * | 11/2011 | Lin et al. .................... 349/113 |
| 8,148,730 B2 | 4/2012 | Hosoya et al. |
| 8,304,297 B2 | 11/2012 | Okada et al. |
| 2001/0010370 A1 * | 8/2001 | Kimura ............. G02F 1/134363 257/59 |
| 2004/0095544 A1 * | 5/2004 | Chang ................ G02F 1/13458 349/152 |
| 2004/0263706 A1 | 12/2004 | Cho et al. |
| 2006/0024895 A1 | 2/2006 | Kim |
| 2006/0121634 A1 * | 6/2006 | Ahn .............................. 438/22 |
| 2006/0145161 A1 * | 7/2006 | Lee .................... G02F 1/13458 257/72 |
| 2006/0275710 A1 | 12/2006 | Yamazaki et al. |
| 2006/0278875 A1 | 12/2006 | Ohnuma et al. |
| 2006/0290867 A1 | 12/2006 | Ahn et al. |
| 2007/0001225 A1 | 1/2007 | Ohnuma et al. |
| 2007/0002249 A1 | 1/2007 | Yoo et al. |
| 2007/0023790 A1 | 2/2007 | Ohnuma et al. |
| 2007/0037070 A1 | 2/2007 | Ohnuma et al. |
| 2007/0085475 A1 | 4/2007 | Kuwabara et al. |
| 2007/0126969 A1 | 6/2007 | Kimura et al. |
| 2007/0139571 A1 | 6/2007 | Kimura |
| 2007/0146591 A1 | 6/2007 | Kimura et al. |
| 2007/0146592 A1 | 6/2007 | Kimura |
| 2007/0148936 A1 | 6/2007 | Ohnuma |
| 2007/0222936 A1 | 9/2007 | Shih |
| 2008/0042133 A1 * | 2/2008 | Chin ....................... H01L 27/12 257/59 |

FOREIGN PATENT DOCUMENTS

| | | |
|---|---|---|
| JP | 2001-313397 A | 11/2001 |
| JP | 2002-151522 A | 5/2002 |
| JP | 2003-045893 A | 2/2003 |
| JP | 2006-163407 A | 6/2006 |
| JP | 2007-133371 A | 5/2007 |
| JP | 2007-226210 A | 9/2007 |

* cited by examiner

US 9,564,517 B2

METHOD FOR MANUFACTURING SEMICONDUCTOR DEVICE

CROSS-REFERENCE TO RELATED APPLICATIONS

This application is a continuation of U.S. application Ser. No. 12/255,312, filed Oct. 21, 2008, now pending, which claims the benefit of a foreign priority application filed in Japan as Serial No. 2007-275781 on Oct. 23, 2007, both of which are incorporated by reference.

BACKGROUND OF THE INVENTION

1. Field of the Invention

The present invention relates to a method for manufacturing semiconductor devices, in particular, a method for manufacturing active matrix display devices.

2. Description of the Related Art

Heretofore, liquid crystal display devices utilizing, as switching elements, TFTs each formed using amorphous silicon have been often used as display devices which have been widely used, such as liquid crystal televisions, displays of personal computers, and cellular phones. A technique by which a TFT is formed using a semiconductor thin film formed over a substrate having an insulating surface has attracted attention. The TFT has been widely applied to electronic devices such as ICs and electro-optical devices and particularly developed as a switching element of an image display device.

For a TFT using amorphous silicon, a layered structure has been conventionally formed through a photolithography process using five or more photomasks. Reduction in photolithography process using photomasks has been desired. Heretofore, each of Patent Document 1 (Japanese Published Patent Application No. 2000-131719) and Patent Document 2 (Japanese Published Patent Application No. 2003-45893) has been known as a technique achieving reduction in number of steps in a photolithography process using photomasks.

FIGS. 10A to 10E are structural views illustrating a conventional TFT using amorphous silicon.

The manufacturing process thereof is described. A gate electrode 501 is formed over a glass substrate 500 by a photolithography step using a first photomask (FIG. 10A).

A gate insulating film 502, an i-type amorphous silicon layer 503, and an n$^+$-type amorphous silicon layer 504 are formed. The i-type amorphous silicon layer 503 and the n$^+$-type amorphous silicon layer 504 form an island region by a photolithography step using a second photomask (FIG. 10B).

A source electrode 508 and a drain electrode 509 are formed by a photolithography step using a third photomask. At that time, a photoresist formed by the third photomask is successively utilized to etch the n$^+$-type amorphous silicon layer so that a channel region 505, a source region 506, and a drain region 507 are formed.

A protective film 510 is formed, and a contact hole through which a contact with a pixel electrode 511 is made is formed by a photolithography step using a fourth photomask (FIG. 10C).

Indium tin oxide (ITO) is formed, and the pixel electrode 511 is formed by a photolithography step using a fifth photomask (FIGS. 10D and 10E).

Photolithography steps using a photomask includes application of a photoresist, pre-baking, a step of light exposure using a metal photomask, a step of development, post-baking, a step of etching, a step of resist separation, and the like. In addition, many steps such as a step of cleaning and a step of inspection are included in the photolithography steps. Thus, performing the conventional process using five photomasks means that the steps are repeated five times, which is a significant factor in the decrease in throughput in the manufacturing process or the increase in manufacturing cost.

SUMMARY OF THE INVENTION

Therefore, reduction in number of photomasks means reduction in manufacturing time and manufacturing cost and thus has been anticipated. In view of mass production, reduction in number of photomasks has been a major object. Further, reduction in number of steps is another object.

In order to achieve the above objects, the present invention adopts a channel-etched bottom gate TFT structure in which a photoresist is selectively exposed to light by rear surface exposure utilizing a gate wiring to form a desirably patterned photoresist, and further, in which a halftone mask or a gray-tone mask is used as a multi-tone mask. Further, the present invention includes a step of lifting off using a halftone mask or a gray-tone mask and a step of performing a reflow process on a photoresist. The step of lifting off is a method in which a pattern other than a target pattern is formed of a photoresist or the like over a substrate, a target thin film is formed, and then an unnecessary portion which overlaps with the photoresist and the photoresist are removed together so that the target pattern is left. The reflow process is a step of processing a photoresist over a substrate by heat treatment or chemical treatment. By repeating combination of the step of lifting off and mask alignment, a thin film of which thickness partially varies or a thin film in which substances partially vary can be patterned.

According to an aspect of the present invention, a method for manufacturing a semiconductor device includes the steps of forming a first conductive film over a substrate; etching the first conductive film using a first photoresist to form a gate electrode; forming a gate insulating film over the gate electrode; forming a first semiconductor layer (e.g. an i-type semiconductor layer) over the gate insulating film; forming a second semiconductor layer including the impurity element imparting one conductivity type (e.g. an n$^+$-type semiconductor layer) over the first semiconductor layer; performing rear surface exposure to form a second photoresist; etching the first semiconductor layer and the second semiconductor layer to form a first semiconductor island and a second semiconductor island using the second photoresist; forming a second conductive film over the second semiconductor island; forming a third photoresist using a multi-tone mask; etching the second conductive film, the second semiconductor island, and the first semiconductor island using the third photoresist; ashing the third photoresist; etching the second conductive film using the third photoresist having been ashed to form a source electrode and a drain electrode; etching the second semiconductor island and the first semiconductor island using the third photoresist having been ashed to form a channel region, a source region, and a drain region; forming an insulating film over the source electrode and the drain electrode; forming a contact hole in the insulating film using a fourth photoresist; forming a conductive film over the insulating film; and etching the conductive film using a fifth photoresist to form a pixel electrode.

According to another aspect of the present invention, a method for manufacturing a semiconductor device includes the steps of forming a first conductive film over a substrate; etching the first conductive film using a first photoresist to form a gate electrode; forming a gate insulating film over the gate electrode; forming a first semiconductor layer (e.g. an i-type semiconductor layer) over the gate insulating film; forming a second semiconductor layer including the impurity element imparting one conductivity type (e.g. an $n^+$-type semiconductor layer) over the first semiconductor layer; performing rear surface exposure to form a second photoresist; etching the first semiconductor layer and the second semiconductor layer to form a first semiconductor island and a second semiconductor island using the second photoresist; forming a second conductive film over the second semiconductor layer; forming a third photoresist using a first multi-tone mask; etching the second conductive film, the second semiconductor layer, and the first semiconductor layer using the third photoresist; ashing the third photoresist; etching the second conductive film using the third photoresist having been ashed to form a source electrode and a drain electrode; etching the second semiconductor layer and the first semiconductor layer using the third photoresist having been ashed to form a channel region, a source region, and a drain region; forming a fourth photoresist using a second multi-tone mask; forming a contact hole in the gate insulating film using the fourth photoresist; ashing the fourth photoresist; forming a conductive film over the fourth photoresist having been ashed; removing the fourth photoresist having been ashed and the conductive film formed over the fourth photoresist together to form a pixel electrode; forming an insulating film over the pixel electrode; performing rear surface exposure to form a fifth photoresist over the insulating film; performing a reflow process on the fifth photoresist; and etching the insulating film using the fifth photoresist having been subjected to the reflow process.

Owing to the advantageous effect of the present invention, whereas a conventional amorphous silicon TFT is manufactured using five photomasks, a TFT can be manufactured using four or three photomasks and thus manufacturing time and cost can be reduced. Further, since rear surface exposure is performed, a self-aligning step is performed and thus a step of aligning the photomask is not required. In the self-aligning step, it doesn't occur that the photomask is out of position; therefore, a margin for misalignment is not required and a more refined pattern can be formed. Further, a channel region is protected from light from external by a gate electrode, so that an increase of a leakage current when the TFT is off can be suppressed.

Further, by adopting a reflow process, the TFT is entirely covered with an insulating film and thus reliability of elements can be improved. That is, an end portion of a source electrode can be surely covered so that a TFT can be prevented from being contaminated. An i-type amorphous silicon layer, an $n^+$-type amorphous silicon layer, a source metal, and a drain metal are etched all at once by the conventional halftone technique. Therefore, the i-type amorphous silicon layer is connected between the elements. Meanwhile, in the present invention, before formation of a source metal and a drain metal, only an i-type amorphous silicon layer and an $n^+$-type amorphous silicon layer are formed into an island region by using a photoresist patterned desirably by rear surface exposure; therefore, the i-type amorphous silicon layer is cut and thus the elements can be more surely separated from each other.

BRIEF DESCRIPTION OF THE DRAWINGS

In the accompanying drawings.

DETAILED DESCRIPTION OF THE INVENTION

Embodiment modes of the present invention will be described below.

The present invention relates to a semiconductor device manufactured using four or three photomasks to reduce the number of steps in the conventional process using five photomasks and a manufacturing method thereof.

FIGS. 1A to 1E, FIGS. 2A to 2D, FIGS. 3A to 3C, FIG. 4, FIGS. 5A and 5B, FIGS. 6A to 6E, FIGS. 7A to 7D, FIGS. 8A to 8C, and FIGS. 9A to 9D are views each illustrating a manufacturing method of the present invention.

In this embodiment mode, a photoresist is selectively exposed to light by rear surface exposure using a gate wiring material as a photomask to obtain a desired pattern so that an island region is formed. Further, a channel region, a source region, a drain region, a source wiring, and a drain wiring are formed by a halftone exposure technique. Although a halftone exposure technique is used in this embodiment mode, a gray tone exposure technique may be used. The combination of the features enables the process using four photomasks which is fewer than five photomasks used for the conventional process. Further, by using a halftone exposure technique, the process using three photomasks becomes possible.

Embodiment Mode 1

The process using four photomasks of the present invention will be described with reference to FIGS. 1A to 1E, FIGS. 2A to 2D, and FIGS. 3A to 3C.

Figure 1A:
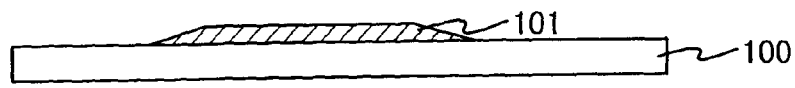
FIGS. 1A to 1E are cross-sectional views illustrating a method for manufacturing a semiconductor device of the present invention.

In FIG. 1A, a metal film is stacked over a glass substrate 100 by a sputtering method. The glass substrate is allowable as long as it has a light transmitting property. Barium borosilicate glass or aluminoborosilicate glass, which is typified by the No. 7059 or No. 1737 glass manufactured by Corning Inc., may be used. Alternatively, a light-transmitting substrate such as a quartz substrate or a plastic substrate may be used. A first photomask is used to form a desired photoresist and then the metal film is etched, so that a gate electrode 101 and a gate wiring are formed. The gate electrode 101 and the gate wiring are desirably formed of a low resistant conductive material such as aluminum (Al) or copper (Cu); however, since aluminum alone has disadvantages such as low heat resistance and a tendency to be corroded, it is used in combination with a material having both heat resistance and conductivity to form the gate electrode 101 and the gate wiring. An AgPdCu alloy may be used as a low resistant conductive material. As a material having both heat resistance and conductivity, an element selected from titanium (Ti), tantalum (Ta), tungsten (W), molybdenum (Mo), chromium (Cr), and neodymium (Nd), an alloy containing any of the above elements as its component, an alloy film combining any of the above elements, or nitride containing any of the above elements as its component. The gate electrode and the gate wiring comprise a conductive film containing any of the above elements or a layered structure of the abovementioned conductive films. For example, a stack of titanium and copper or a stack of tantalum nitride and copper can be used. In the case where a low resistant conductive material is used in combination with a material having both heat resistance and conductivity such as titanium, silicon, chromium, or neodymium, flatness is improved, which is preferable. Alternatively, only such materials having both heat resistance and conductivity, for example, molybdenum and tungsten, may be used in combination.

Figure 1B:
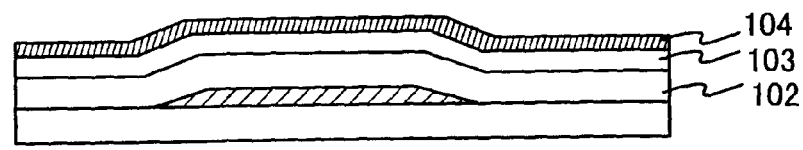

In FIG. 1B, an insulating film 102, an i-type amorphous silicon layer 103, and an $n^+$-type amorphous silicon layer 104 are sequentially formed over the gate electrode 101. The insulating film 102 is to form the gate insulating film 102 later and formed to have, for example, a single-layer structure of a silicon nitride film, a silicon oxide film, or a silicon oxynitride film or a layered structure of any of the above films. It is needless to say that the material of the gate insulating film is not limited to the above materials and may have a single-layer or layered structure using any other insulating film such as a tantalum oxide film. The i-type amorphous silicon layer 103 and the $n^+$-type amorphous silicon layer 104 are to form a channel region, a source region, and a drain region later. The i-type amorphous silicon layer 103 is a non-doped layer which does not contain an impurity imparting conductivity. The i-type amorphous silicon layer 103 may contain a very small amount of impurities. Also, the $n^+$-type amorphous silicon layer 104 is a semiconductor film containing an impurity element imparting one conductivity type, in particular, an n-type semiconductor layer containing phosphorus at high concentration. The insulating film 102, the i-type amorphous silicon layer 103, and the $n^+$-type amorphous silicon layer 104 are formed by a CVD method. A multi-chamber CVD apparatus enables even successive film formation. They are thus formed by not being exposed to the air, so that an impurity is prevented from being mixed. Although a CVD method is used in this embodiment mode, a sputtering method or the like may alternatively be used.

Figure 1C:
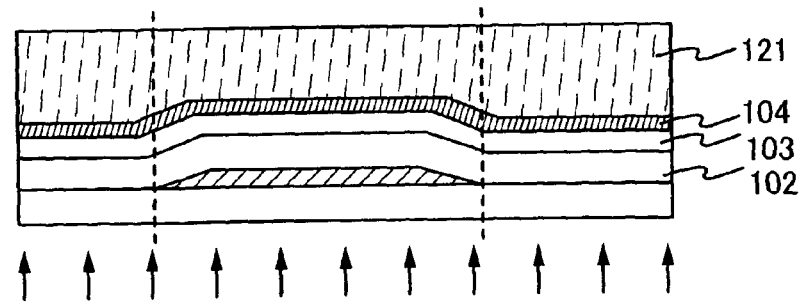
Figure 1D:
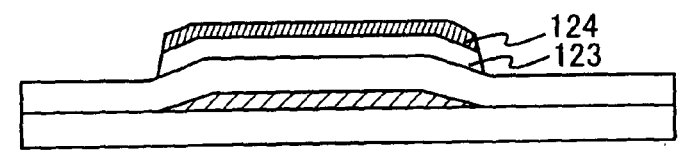

In FIG. 1C, a photoresist 121 formed over the $n^+$-type amorphous silicon layer 104 is selectively exposed to light by rear surface exposure with the metal film of the gate electrode 101 and the gate wiring as a photomask, so that a desirable photoresist pattern is formed. By rear surface exposure, light transmits a thin film and the photoresist 121 is exposed to light; therefore, the layers other than the gate wiring 101, that is, the i-type amorphous silicon layer 103 and the $n^+$-type amorphous silicon layer 104 are necessarily thin enough to be exposed to light. That is to say, light transmits the i-type amorphous silicon layer 103 and the $n^+$-type amorphous silicon layer 104 to expose the photoresist 121. By using the photoresist pattern formed by rear surface exposure, the i-type amorphous silicon layer 103 and the $n^+$-type amorphous silicon layer 104 are etched to form an i-type amorphous silicon island 123 and an $n^+$-type amorphous silicon island 124 as shown in FIG. 1D. In the case of performing rear surface exposure, a self-aligning step is performed and thus a step of aligning the photomask is not required, so that etching can be performed in a self-aligned manner while the photoresist pattern after exposure is not misaligned.

Figure 1E:
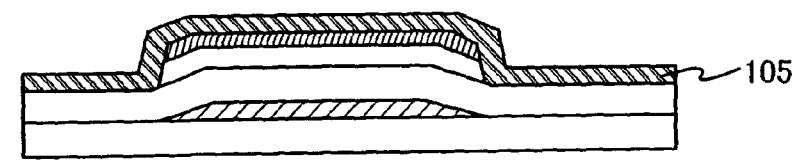

In FIG. 1E, a metal film 105 is formed over an entire surface of the substrate. The metal film 105 is to form a source electrode, a drain electrode, and a source wiring later. The material of the metal film 105 is allowable as long as it is a metal material which can provide ohmic contact with the $n^+$-type amorphous silicon island 124, and an element selected from aluminum, chromium, tantalum, and titanium, an alloy containing any of the above elements as its component, an alloy film combining any of the above elements, and the like are given.

Figure 2A:
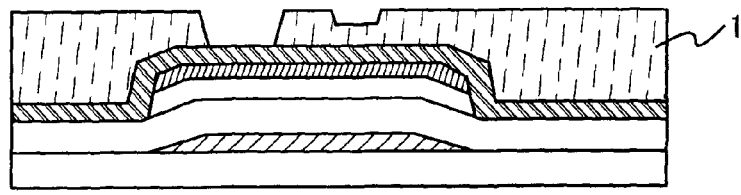
FIGS. 2A to 2D are cross-sectional views illustrating a method for manufacturing a semiconductor device of the present invention.

In FIG. 2A, a photoresist 1 is formed using a second photomask. For the photoresist 1, a halftone exposure technique is used. That is, a photoresist of which thickness varies is formed. Parts which are to form a source electrode, a drain electrode, and a source wiring are formed thick and a part which is to form a channel is formed thin.

Figure 2B:
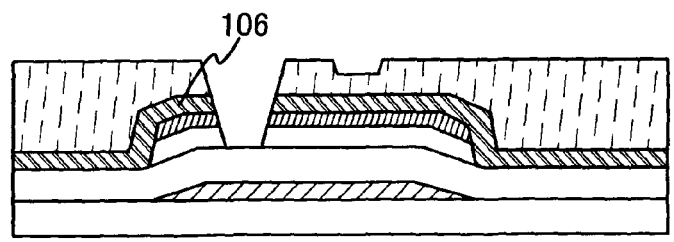

In FIG. 2B, etching is performed using the photoresist 1. Thus, a wiring 106 is formed.

Figure 2C:
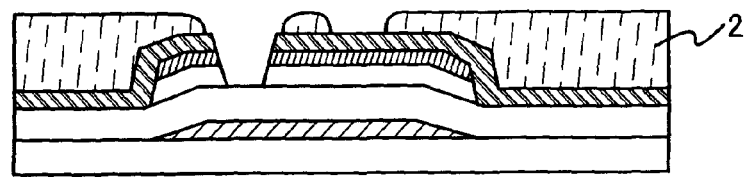

In FIG. 2C, the photoresist 1 is subjected to ashing treatment to be processed such that the shape of the photoresist 1 is like that of a photoresist 2 of FIG. 2C. That is, the part of the photoresist, which has been formed thin, is exposed.

Figure 2D:
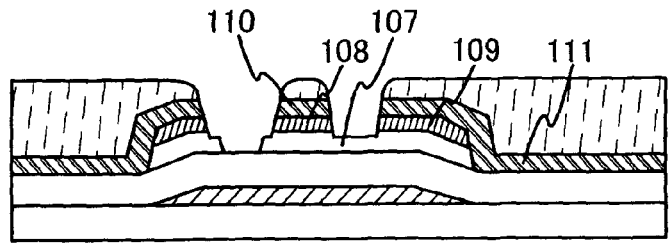

In FIG. 2D, the photoresist 2 which has been processed by ashing is used to etch the metal film 105 so that the source electrode 110 and the drain electrode 111 are formed. Similarly, the photoresist 2 is used to etch the $n^+$-type amorphous silicon island 124 and the i-type amorphous silicon island 123 so that a channel region 107, a source region 108, and a drain region 109 are formed. The i-type amorphous silicon layer which overlaps with the gate electrode 101 with the gate insulating film 102 interposed therebetween forms a channel formation region 107. After that, the photoresist 2 is removed by separation.

Figure 3A:
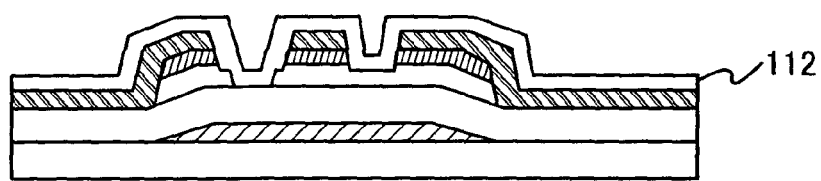
FIGS. 3A to 3C are cross-sectional views illustrating a method for manufacturing a semiconductor device of the present invention.

In FIG. 3A, an insulating film is formed over an entire surface of the substrate to serve as a protective film 112. The insulating film serving as the protective film may be a silicon nitride film, a silicon oxide film, or a stack of the films. The silicon nitride film is particularly preferred because of high passivation performance thereof.

Figure 3B:
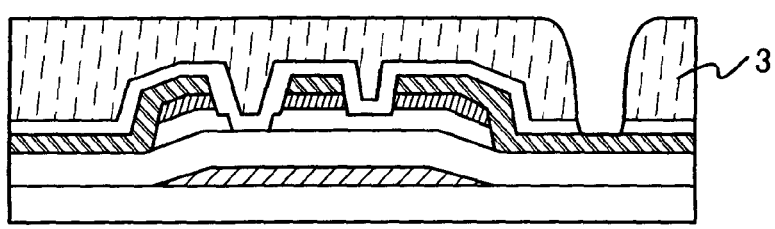

In FIG. 3B, an opening of a contact portion, which exposes the drain electrode 111, is formed by a photoresist 3 formed using a third photomask.

Figure 3C:
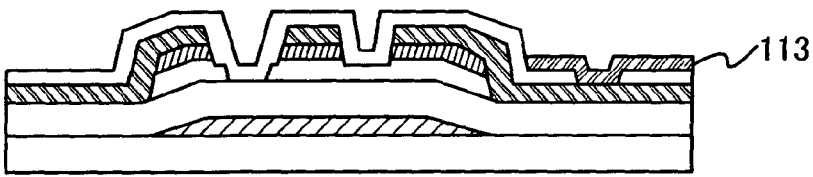

In FIG. 3C, ITO is formed over an entire surface of the substrate, a desired photoresist is formed using a fourth photomask, and a pixel electrode 113 is formed using the photoresist. Although ITO is used as a pixel electrode material in this embodiment mode, tin oxide, indium oxide, nickel oxide, zinc oxide, or a compound of any of the above may be used as a transparent conductive material, for example.

Although the i-type amorphous silicon layer is used as a channel region 107 in this embodiment mode, it is also possible that a microcrystal semiconductor film (also referred to as a semi-amorphous semiconductor film) be formed, a buffer layer be formed over the microcrystal semiconductor film, and an n$^+$-type amorphous silicon layer be formed over the buffer layer. The buffer layer may be an amorphous silicon layer and preferably contains one or more of nitrogen, hydrogen, and halogen. The amorphous silicon layer contains any one or more of nitrogen, hydrogen, and halogen, so that a crystal grain contained in the microcrystal semiconductor film can be prevented from being oxidized. The buffer layer is formed between the source region and the drain region; therefore, a TFT has higher mobility, a smaller amount of leakage current, and a higher withstand voltage.

Figure 4:
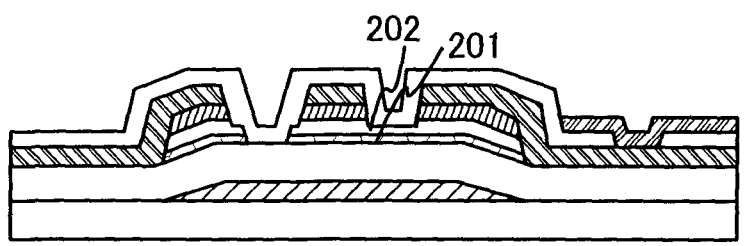
FIG. 4 is a cross-sectional view illustrating a method for manufacturing a semiconductor device of the present invention.

FIG. 4 illustrates a TFT in which a microcrystalline semiconductor film 201 and a buffer layer 202 are formed in this order as a channel region instead of the i-type amorphous silicon layer. By using the microcrystalline semiconductor film 201 and the buffer layer 202 instead of the i-type amorphous silicon layer, the TFT can be formed to have higher mobility, a smaller amount of leakage current, and a higher withstand voltage.

Figure 5A:
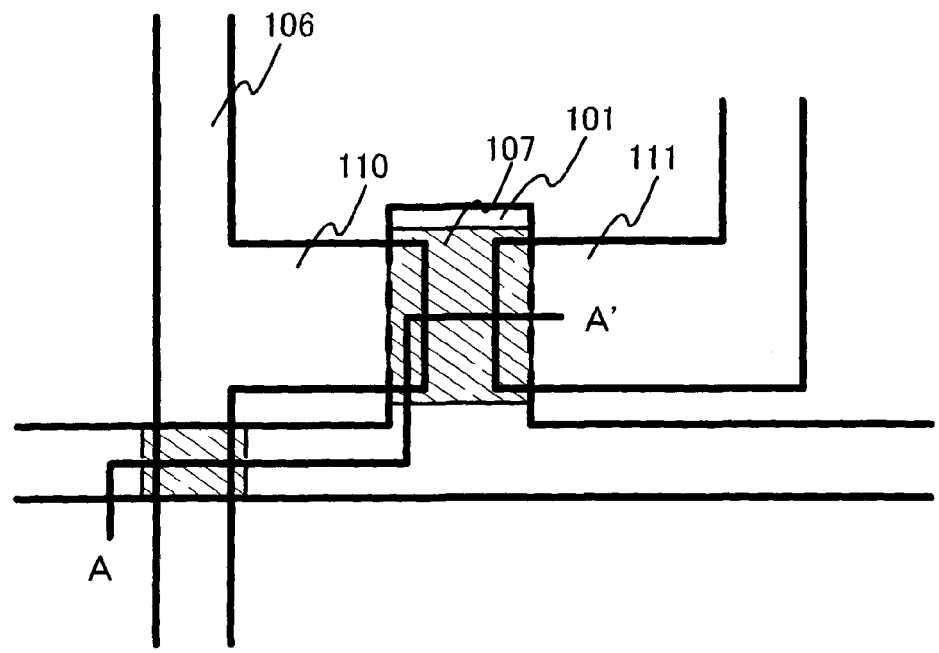
FIGS. 5A and 5B are a top plan view and a cross-sectional view illustrating a method for manufacturing a semiconductor device of the present invention, respectively.
Figure 5B:
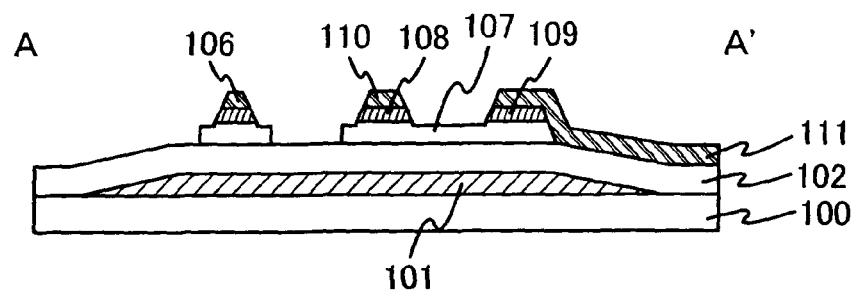

FIG. 5A illustrates a top plan view of the TFT of this embodiment mode. Note that the same reference numerals are used for the parts corresponding to those in FIGS. 1A to 1E, FIGS. 2A to 2D, and FIGS. 3A to 3C. FIG. 5B corresponds to a cross sectional view taken along line A-A' in FIG. 5A.

Thus, inverted-staggered n-channel TFTs can be completed through the photolithography process using four photomasks. Then, they are arranged in matrix corresponding to pixels so that a pixel portion is formed, which can be a substrate for fabricating an active matrix electrooptic device.

Embodiment Mode 2

Next, the process using three photomasks of the present invention will be described with reference to FIGS. 6A to 6E, FIGS. 7A to 7D, and FIGS. 8A to 8C. Description will be made including that of a terminal portion from a step using the second photomask, which requires a halftone exposure technique in FIG. 1E. That is, the step in FIG. 6A follows the step in FIG. 1E.

Figure 6A:
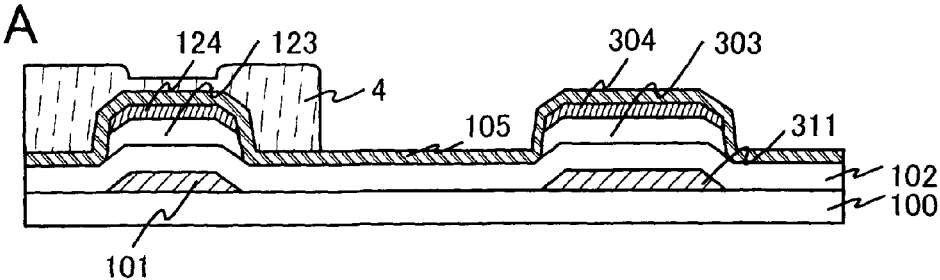
FIGS. 6A to 6E are cross-sectional views illustrating a method for manufacturing a semiconductor device of the present invention.

In FIG. 6A, a photoresist 4 is formed, using the second photomask, over a glass substrate 100, a gate electrode 101, a wiring 311, an insulating film 102, an i-type amorphous silicon layer 123, a semiconductor layer including an impurity element imparting one conductivity type, which is particularly an n$^+$ amorphous silicon layer 124, and a metal layer 105. For the photoresist 4, a halftone exposure technique is used. That is, a photoresist of which thickness varies is formed. Parts which are to form a drain electrode and a source wiring are formed thick and a part which is to form a channel is formed thin.

Figure 6B:
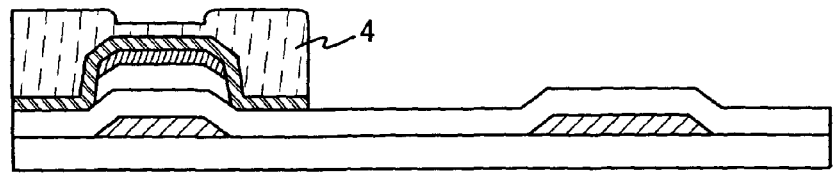

In FIG. 6B, parts of the i-type amorphous silicon layer 303, the n$^+$-type amorphous silicon layer 304, and the metal film 105, which are not covered with the photoresist 4, are etched.

Figure 6C:
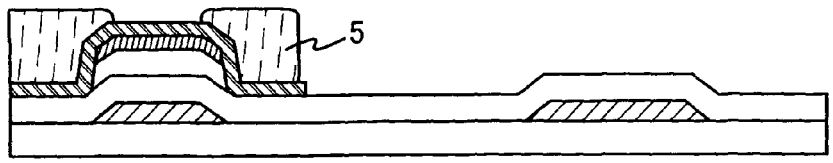

In FIG. 6C, the photoresist 4 is processed by ashing to form a photoresist 5.

Figure 6D:
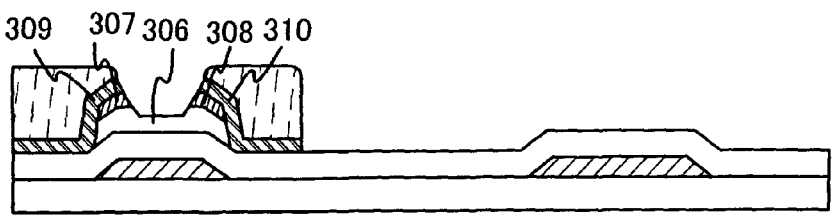

In FIG. 6D, a source electrode 309 and a drain electrode 310 are formed using the photoresist 5 processed by ashing. Similarly, a channel region 306, a source region 307, and a drain region 308 are formed using the photoresist 5. After that, the photoresist 5 is removed. The i-type amorphous silicon layer 123 which overlaps with the gate electrode with the gate insulating film interposed therebetween forms the channel region 306.

Figure 6E:
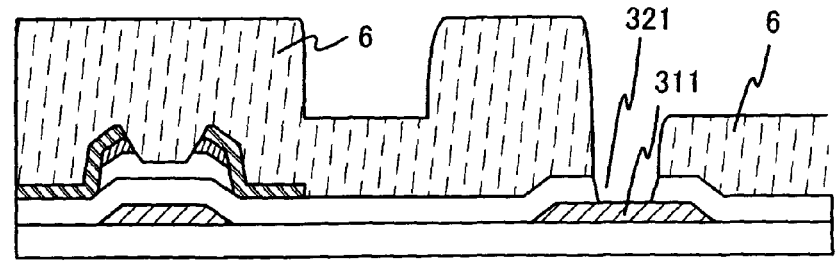

In FIG. 6E, a photoresist 6 is formed using a third photomask. A halftone exposure technique is also used here. Part of the insulating film 102, which is not covered with the photoresist 6, is etched to form a contact hole 321 so that a wiring 311 is exposed. The wiring 311 may comprise a single layer or a layered structure using aluminum (Al), copper (Cu), titanium (Ti), tantalum (Ta), tungsten (W), molybdenum (Mo), chromium (Cr), and neodymium (Nd). This exposed part forms a connection portion with a transparent conductive film on the terminal portion.

Figure 7A:
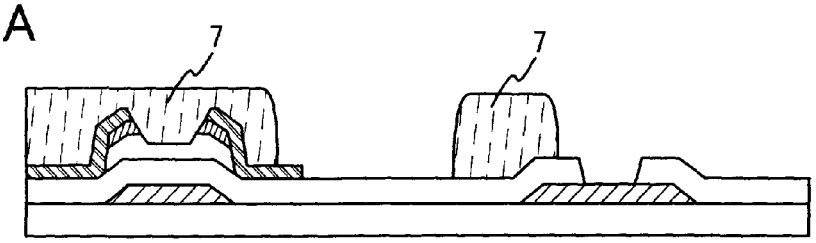
FIGS. 7A to 7D are cross-sectional views illustrating a method for manufacturing a semiconductor device of the present invention.

In FIG. 7A, the photoresist 6 is processed by ashing to form a photoresist 7.

Figure 7B:
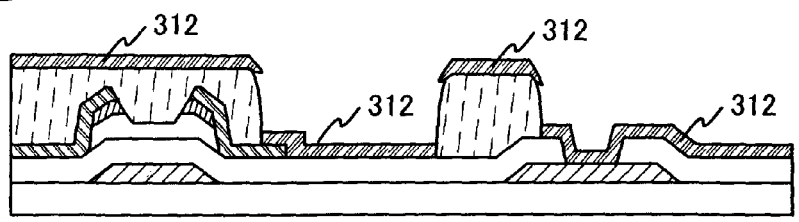

In FIG. 7B, a transparent conductive film 312 is formed over the photoresist 7.

Figure 7C:
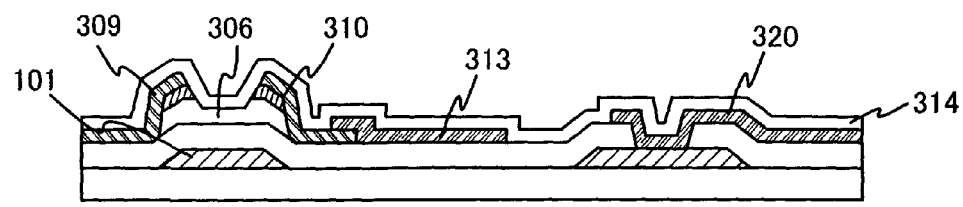

In FIG. 7C, the photoresist 7 and portions of the transparent conductive film 312 formed on the photoresist 7 are removed together by a step of lifting off, so that a pixel electrode 313 and a wiring 320 are formed. After that, a protective film 314 is formed over an entire surface of the substrate by a CVD method. An insulating film which serves as the protective film may be a silicon nitride film, a silicon oxide film, or a stack of them. A silicon nitride film is particularly preferred because of high passivation performance thereof.

Figure 7D:
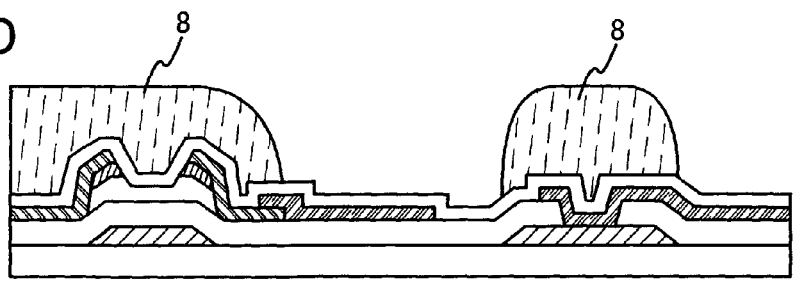

In FIG. 7D, a photoresist is applied to the protective film 314 and selectively exposed to light by rear surface exposure, so that a desirably patterned photoresist 8 is formed. Here, the photoresist 8 is not formed over only transparent films, that is, part including only the transparent conductive film 312 and the insulating film 302 because light is transmitted. Since rear surface exposure is performed, it is preferable that the gate electrode 301, the source electrode 309, and the drain electrode 310 sufficiently overlap with each other in the channel region.

Figure 8A:
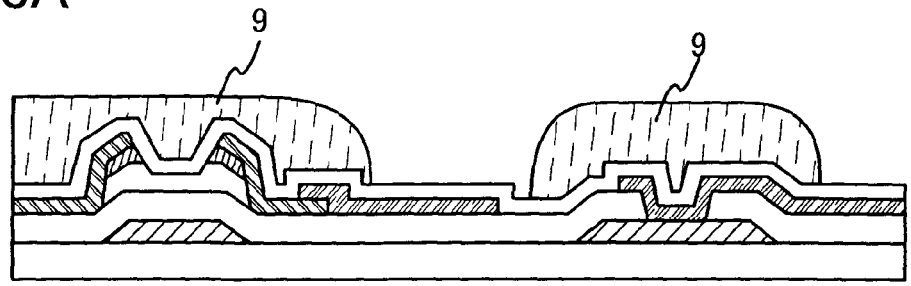
FIGS. 8A to 8C are cross-sectional views illustrating a method for manufacturing a semiconductor device of the present invention.

In FIG. 8A, the photoresist 8 formed by the rear surface exposure is subjected to heat treatment as a reflow process. And when seen in section, the photoresist 8 forms a photoresist 9 such that an end portion of the photoresist 8 is extended slightly outward. Further, the photoresist 8 is reduced in thickness to form the photoresist 9 by the reflow process. Although not illustrated, a range of the photoresist 8, which covers the substrate, is slightly increased when seen from the top surface, so that the photoresist 9 is formed. That is, the distance between the edge of the photoresist and the edge of the source electrode and the distance between the edge of the photoresist and the edge of the drain electrode are increased. As the reflow process, chemical treatment may be performed instead of heat treatment.

Figure 8B:
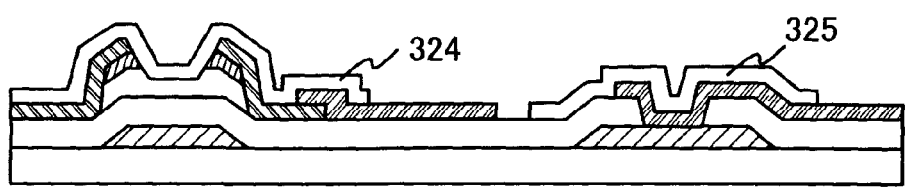

In FIG. 8B, the protective film 314 is etched using the photoresist 9 formed by slightly extending an end portion of the photoresist 8 outward and thus reducing the photoresist 8 in thickness, so that the pixel electrode 313 is partly exposed. The exposed region forms a pixel region. By the reflow process, the end portion of the photoresist 8 is extended slightly outward. Therefore, the protective film 324 after etching is extended so that outer sides of the end portions of the source electrode and the drain electrode can be protected. Thus, a TFT or an electrode in a lower layer can be more surely protected. Further, in a peripheral portion, the contact hole 321 can be surely protected by the protective film 325.

Figure 8C:
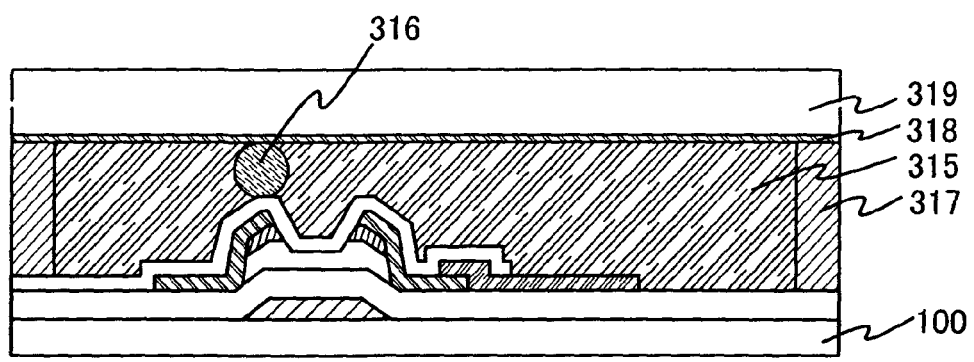

FIG. 8C is a view in the case where an LCD panel is manufactured using a TFT substrate in FIG. 8B. A counter substrate 319 is provided to face the glass substrate 100 over which TFTs are formed. The counter substrate 319 is provided with a color filter 318. A liquid crystal 315 and a spacer 316 are provided between the glass substrate 100 and the counter substrate 319 and are sealed with a sealant 317.

Thus, inverted-staggered n-channel TFTs can be completed through the photolithography process using three photomasks. Then, they are arranged in matrix corresponding to pixels so that a pixel portion is formed, which can be a substrate for fabricating an active matrix electrooptic device.

Embodiment Mode 3

Next, the structure of a connection terminal portion connected to a peripheral circuit provided on the periphery of a pixel portion will be described taking FIGS. 9A to 9D as an example.

Figure 9A:
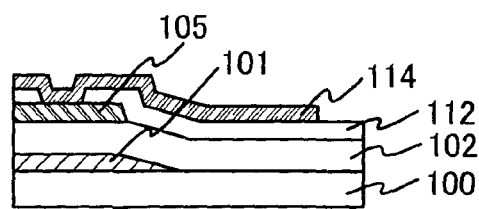
FIGS. 9A to 9D are cross-sectional views each illustrating a periphery of a pixel portion of a semiconductor device of the present invention.
Figure 9B:
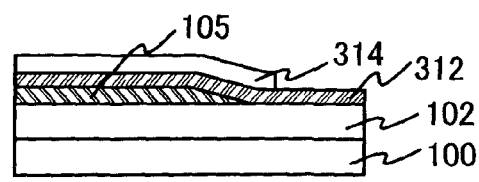

FIGS. 9A and 9B each illustrate a structure in the case where a source wiring is lead to an end portion of a substrate. FIG. 9A illustrates the case of Embodiment Mode 1 and FIG. 9B illustrates the case of Embodiment Mode 2. Note that the same reference numerals are used for the parts corresponding to those in FIGS. 1A to 1E, FIGS. 2A to 2D, FIGS. 3A to 3C, FIG. 4, FIGS. 5A and 5B, FIGS. 6A to 6E, FIGS. 7A to 7D, and FIGS. 8A to 8C. In the case of FIG. 9A, the protective film 112 is etched using the photoresist 3 in FIG. 3B to expose the wiring 106 so that the wiring 106 is in contact with the transparent conductive film 114. In the case of FIG. 9B, the metal film 105 and the transparent conductive film 312 are made to be in contact with each other using the photoresist 7 in FIG. 7B. Then, the protective film 314 is etched using the photoresist 9 to expose the transparent conductive film 312. The transparent conductive films 114 and 312 form connection terminals and are each connected to an FPC (flexible printed circuit) with a conductive adhesive such as an anisotropic conductive film interposed therebetween.

Figure 9C:
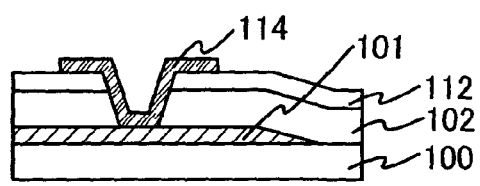
Figure 9D:
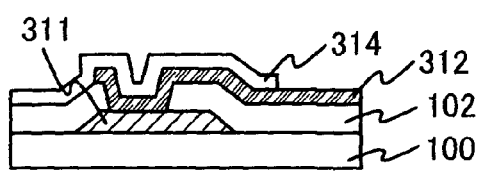
Figure 10A:
FIGS. 10A to 10E are cross-sectional views illustrating a method for manufacturing a conventional semiconductor device.
Figure 10B:
Figure 10C:
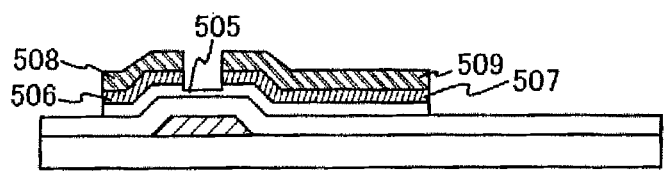
Figure 10D:
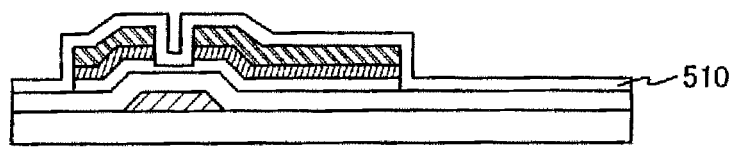
Figure 10E:
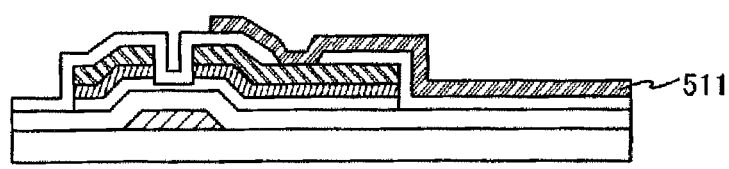

FIGS. 9C and 9D each illustrate a structure in the case where a gate wiring is lead to an end portion of a substrate. FIG. 9C illustrates the case of Embodiment Mode 1 and FIG. 9D illustrates the case of Embodiment Mode 2. Note that the same reference numerals are used for the parts corresponding to those in FIGS. 1A to 1E, FIGS. 2A to 2D, FIGS. 3A to 3C, FIG. 4, FIGS. 5A and 5B, FIGS. 6A to 6E, FIGS. 7A to 7D, and FIGS. 8A to 8C. In the case of FIG. 9C, the gate insulating film 102 is exposed using the photoresist 1 in FIG. 2B, and the gate insulating film 102 and the protective film 112 are etched using the photoresist 3 in FIG. 3B so that the gate wiring is in contact with the transparent conductive film 114. In the case of FIG. 9D, the gate electrode 301 is exposed using the photoresist 6 in FIG. 6E, and the gate electrode 301 and the transparent conductive film 312 are made to be in contact with each other using the photoresist 7 in FIG. 7B. Then, the protective film 314 is etched using the photoresist 9 to expose the transparent conductive film 312.

Thus, a semiconductor device can be manufactured by the process using four or three photomasks, in which the number of photomasks is reduced and the number of steps is also reduced, as compared to the conventional process using five photomasks.

Figure 11A:
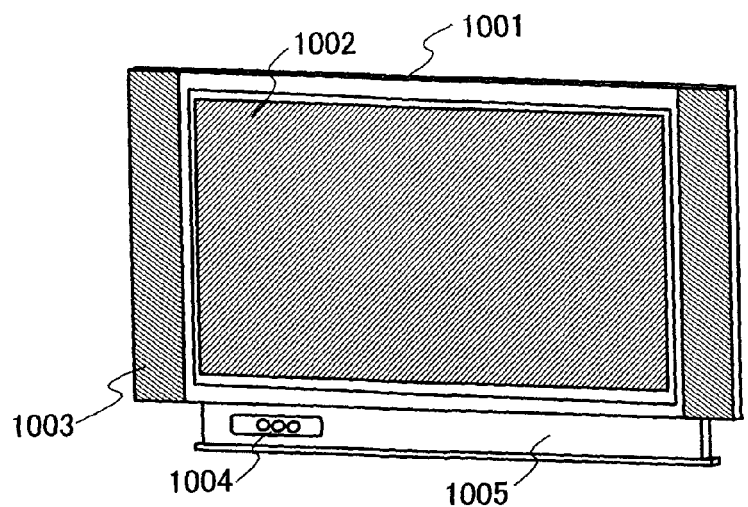
FIGS. 11A to 11C are diagrams each illustrating a semiconductor device of the present invention.
Figure 11B:
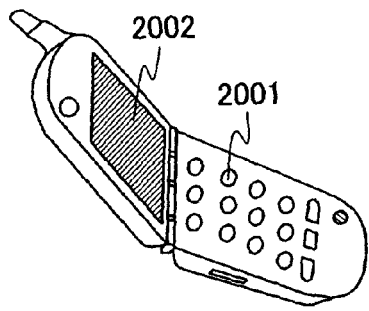
Figure 11C:
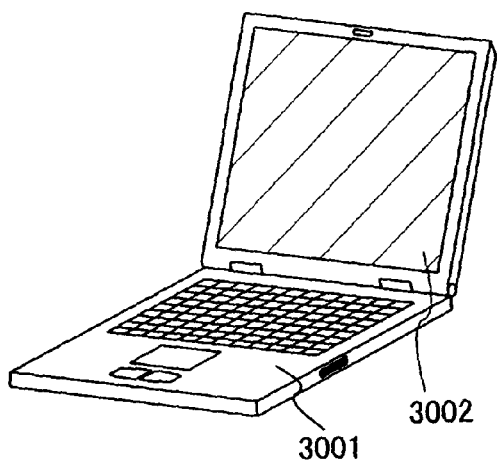

FIGS. 11A to 11C illustrate a television set, a portable information terminal (such as a mobile computer, a cellular phone, a mobile game console, or an electronic book), and a laptop computer, respectively, as examples of a semiconductor device and an electronic appliance of the present invention.

FIG. 11A illustrates a display device including a housing 1001, a display portion 1002, speakers 1003, a video input terminal 1004, a supporting base 1005, and the like. The display device is manufactured using TFTs formed by the manufacturing method described in any of the aforementioned embodiment modes for the display portion 1002 and a driver circuit thereof. Note that as the display device, a liquid crystal display device, a light emitting device, and the like are given. Specifically, the display device includes all display devices for information display, such as those for computers, television broadcasting reception, and advertisement display. According to the present invention, an inexpensive and highly reliable display device can be realized.

A cellular phone illustrated in FIG. 11B includes control switches 2001, a display portion 2002, and the like. According to the present invention, an inexpensive and highly reliable cellular phone can be realized.

FIG. 11C illustrates a laptop personal computer including a main body 3001, a display portion 3002, and the like. According to the present invention, an inexpensive and highly reliable laptop personal computer can be realized.

This application is based on Japanese Patent Application serial no. 2007-275781 filed with Japan Patent Office on Oct. 23, 2007, the entire contents of which are hereby incorporated by reference.

What is claimed is:

1. A method for manufacturing a semiconductor device, comprising the steps of:
forming a gate electrode;
forming a wiring;
forming a gate insulating film over the gate electrode and the wiring;
forming a semiconductor layer over the gate insulating film;
performing first rear surface exposure to form a first photoresist over the semiconductor layer;
etching the semiconductor layer using the first photoresist to form a semiconductor island;
forming an electrode over the semiconductor island;
forming a second photoresist over and in contact with the semiconductor island and the electrode by using a multi-tone mask;
exposing a top surface of the wiring by etching part of the gate insulating film using the second photoresist;
exposing a top surface of the gate insulating film by ashing the second photoresist;
forming a transparent conductive film over the second photoresist subjected to the ashing;
removing the second photoresist and the transparent conductive film formed over the second photoresist together to form a pixel electrode;
forming an insulating layer over the pixel electrode;
performing second rear surface exposure to form a third photoresist over the insulating layer;
performing a reflow process on the third photoresist; and
etching the insulating layer using the third photoresist subjected to the reflow process,
wherein the second photoresist subjected to the ashing is formed over and in direct contact with a first part of the gate insulating film, and wherein the first part of the gate insulating film is exposed by etching the insulating layer.

2. The method for manufacturing a semiconductor device, according to claim 1, wherein the first rear surface exposure is performed through the semiconductor layer.

3. The method for manufacturing a semiconductor device, according to claim 1, wherein the second rear surface exposure is performed through the insulating layer.

4. The method for manufacturing a semiconductor device according to claim 1, wherein the semiconductor layer is an amorphous semiconductor layer.

5. The method for manufacturing a semiconductor device according to claim 1, wherein the insulating layer comprises at least one of silicon nitride and silicon oxide.

6. The method for manufacturing a semiconductor device according to claim 1, wherein the electrode is a source electrode or a drain electrode.

7. The method for manufacturing a semiconductor device according to claim 1, wherein the gate electrode and the electrode overlap each other.

8. The method for manufacturing a semiconductor device according to claim 1, wherein the pixel electrode is a transparent electrode.

9. A method for manufacturing a semiconductor device, comprising the steps of:
forming a gate electrode;
forming a wiring;
forming a gate insulating film over the gate electrode and the wiring;
forming a first semiconductor layer over the gate insulating film;
forming a second semiconductor layer over the first semiconductor layer;
performing first rear surface exposure to form a first photoresist over the second semiconductor layer;
etching the first semiconductor layer and the second semiconductor layer using the first photoresist to form a first semiconductor island and a second semiconductor island;
forming an electrode over the first semiconductor island and the second semiconductor island;
forming a second photoresist over and in contact with the second semiconductor island and the electrode by using a multi-tone mask;
exposing a top surface of the wiring by etching part of the gate insulating film using the second photoresist;
exposing a top surface of the gate insulating film by ashing the second photoresist;
forming a transparent conductive film over the second photoresist subjected to the ashing;
removing the second photoresist and the transparent conductive film formed over the second photoresist together to form a pixel electrode;
forming an insulating layer over the pixel electrode;
performing second rear surface exposure to form a third photoresist over the insulating layer;
performing a reflow process on the third photoresist; and
etching the insulating layer using the third photoresist subjected to the reflow process,
wherein the second photoresist subjected to the ashing is formed over and in direct contact with a first part of the gate insulating film, and
wherein the first part of the gate insulating film is exposed by etching the insulating layer.

10. The method for manufacturing a semiconductor device, according to claim 9, wherein the first rear surface exposure is performed through the first semiconductor layer and the second semiconductor layer.

11. The method for manufacturing a semiconductor device, according to claim 9, wherein the second rear surface exposure is performed through the insulating layer.

12. The method for manufacturing a semiconductor device according to claim 9, wherein each of the first semiconductor layer and the second semiconductor layer is an amorphous semiconductor layer.

13. The method for manufacturing a semiconductor device according to claim 9, wherein the insulating layer comprises at least one of silicon nitride and silicon oxide.

14. The method for manufacturing a semiconductor device according to claim 9, wherein the electrode is a source electrode or a drain electrode.

15. The method for manufacturing a semiconductor device according to claim 9, wherein the gate electrode and the electrode overlap each other.

16. The method for manufacturing a semiconductor device according to claim 9, wherein the pixel electrode is a transparent electrode.

* * * * *